(12) United States Patent
Savage

(10) Patent No.: US 7,080,348 B2
(45) Date of Patent: Jul. 18, 2006

(54) CREATING POLYNOMIAL DIVISION LOGICAL DEVICES

(75) Inventor: Paul Savage, Ashburton (AU)

(73) Assignee: Agilent Technologies, Inc., Palo Alto, CA (US)

( * ) Notice: Subject to any disclaimer, the term of this patent is extended or adjusted under 35 U.S.C. 154(b) by 391 days.

(21) Appl. No.: 10/608,603

(22) Filed: Jun. 27, 2003

(65) Prior Publication Data

US 2004/0267681 A1    Dec. 30, 2004

(51) Int. Cl.
*G06F 17/50* (2006.01)

(52) U.S. Cl. ........................................................ 716/18
(58) Field of Classification Search ................ 716/1–7, 716/17–18; 706/19; 714/758
See application file for complete search history.

(56) References Cited

U.S. PATENT DOCUMENTS

| | | | | |
|---|---|---|---|---|
| 5,905,664 A * | 5/1999 | Ko et al. | ..................... | 708/491 |
| 6,295,626 B1 * | 9/2001 | Nair et al. | ................... | 714/807 |
| 6,442,747 B1 * | 8/2002 | Schzukin | ...................... | 716/18 |
| 6,587,590 B1 * | 7/2003 | Pan | ............................. | 382/250 |
| 6,883,132 B1 * | 4/2005 | Dotson | ....................... | 714/774 |
| 6,968,492 B1 * | 11/2005 | Annadurai et al. | ......... | 714/776 |
| 2002/0144208 A1 * | 10/2002 | Gallezot et al. | ............ | 714/781 |

* cited by examiner

*Primary Examiner*—A. M. Thompson
*Assistant Examiner*—Nghia M. Doan

(57) ABSTRACT

A method of creating a logical device performing polynomial division includes using a hardware description language to build code directly describing synthesizable logic for performing the polynomial division. The logic is then implemented on a target device. The code receives as inputs a parameter identifying a polynomial and a parameter identifying a number of data bits for which the polynomial division is performed. For a given n-degree polynomial, performing the polynomial division includes calculating a next n-term remainder for a data unit having d terms.

22 Claims, 7 Drawing Sheets

CREATING POLYNOMIAL DIVISION LOGICAL DEVICES

FIELD OF THE INVENTION

The field of the invention relates to creating logical devices for performing polynomial division. In particular, it relates to a method of using a hardware description language to build code which can be directly synthesized to create a logical device for performing polynomial division and optionally optimizing code using pipelined stages to achieve a maximum operating frequency in the logical device. The polynomial division has applications in calculating a Cyclic Redundancy Check for an m-bit data word, in error correction schemes and in scramblers.

BACKGROUND TO THE INVENTION

A cyclic redundancy check (CRC) is used to detect errors in stored or transmitted data. A CRC is calculated using an algorithm which divides the data block by a generator polynomial to produce a remainder. This remainder is the CRC and it is usually appended to the data block before it is transmitted or stored. When the block of data with the appended CRC is received or retrieved from storage, the CRC algorithm is applied to the data block for a second time and may be compared with the originally calculated CRC. If they are identical, the data block is said to contain no errors with a known confidence interval. If the two CRCs do not match, then the data contains an error.

CRC algorithms and their methods of application are known. In one method, known as the feedback method, the message or block of data for which the CRC is calculated must be augmented by appending n zero's to the message, where n is the number of bits in the CRC (i.e. the order of the generator polynomial). An alternative for implementing a CRC algorithm known as the feed forward method does not require augmentation of the message.

A CRC calculation can be implemented in hardware using shift register arrangements which are known. In the feedback method, n zeros are pushed through the register after the original message. Using the feed forward method, the CRC registers contain the CRC value for the message as soon as the last bit of the message arrives. This is particularly useful in transmission systems where the CRC must be appended immediately after the message or data block. In contrast, using the feedback method, the system would need to wait an additional n clock cycles until the CRC calculation is complete.

CRC circuits can be built using digital logic and may be implemented in programmable logic devices such as Field Programmable Gate Arrays (FPGAs) or Application Specific Integrated Circuits (ASICs). This hardware can be designed either with schematics or using a language which describes digital electronic systems such as VHDL (VHSIC Hardware Description Language) and Verilog®. Once the VHDL or Verilog® code is written to describe the desired behavior of the digital logic circuit, it can be synthesized by using a development tool suitable for the target device to create the final hardware with the desired function or behavior. Digital logic CRC calculators can also be designed to work on a word or an m-bit bus instead of a single bit serial stream. Such CRC calculators are often created using tools such as code generators. For example, to design a CRC calculator capable of working on an m-bit bus, a code generator, for example written in 'C', Perl or other programming language is used. Code generators generate synthesizable High Level Description language (HDL) code such as VHDL or Verilog® based on specific input parameters which are accepted by the code generator. In the case of a CRC calculator for an m-bit bus, these parameters are (i) the CRC generator polynomial and (ii) data bus width. Therefore, the code generator generates HDL code for a logic circuit specific to the CRC generator polynomial and word or data bus width that are passed as inputs to the code generator program.

A limitation of this method of creating CRC calculators is each time a new CRC generator polynomial (i.e. a polynomial with more or less terms) is to be used in the CRC calculator, a designer must use the code generator to produce new HDL code suitable for that polynomial and data word width combination. That is, the HDL code created by the code generator is specific to each CRC polynomial and data word width combination. Therefore the HDL code is not transportable across a range of combinations and unique HDL code is required for every polynomial and data word width combination. This consumes valuable programming resources and ultimately results in an undesirable delay between identifying a new generator polynomial and word/bus width combination and providing a suitable CRC calculator circuit.

In addition to these limitations, the code produced using existing methods for creating a CRC calculator results in logic with maximum operating frequencies which are less than desirable for real time calculation of CRCs in certain applications. Further, they do not allow the designer to make a trade off between the maximum frequency of operation and silicon area, using a single value setting that is specified as a parameter that is passed to the HDL code module.

SUMMARY OF THE INVENTION

A method according to a first embodiment of the present invention creates a logical device performing polynomial division. The method includes using a hardware description language to build code directly describing synthesizable logic for performing the polynomial division and implementing the logic on a target device. The code receives as inputs a parameter identifying a polynomial and a parameter identifying a number of data bits for which the polynomial division is performed.

A method according to a second embodiment of the invention creates a logical device performing polynomial division for a given n-degree polynomial. The polynomial division includes calculating a next n-term remainder for an incoming data unit having d terms. The method includes creating code using a high level description language directly describing synthesizable logic for performing the polynomial division. The polynomial division includes automatically extracting a subset of data terms for calculating each of the next remainder terms. The next remainder is then calculated by performing a logical XOR operation on the subset of data terms with a subset of relevant remainder terms calculated for a preceding data unit. The method further includes implementing the logic on a target device. Preferably, the XOR operation includes a pipelined XOR operation with a pre-definable number of pipeline stages, the pipelined XOR operation operating on the subset of data terms. Pipelining may improve performance of the logical device.

According to a third embodiment of the invention, a computer program product residing on a programmable medium contains hardware description language code directly describing synthesizable logic suitable for implementation on a target device. The target device conveys a programmed method of performing polynomial division on units of data each having d terms and using an n-degree polynomial to calculate a next remainder having n terms. The programmed method includes automatically extracting a subset of data terms for calculating each of the next remainder terms and calculating the next remainder by performing a logical XOR operation on the subset of data terms with a subset of relevant remainder terms calculated for a preceding data unit.

DETAILED DESCRIPTION

Figure 1:
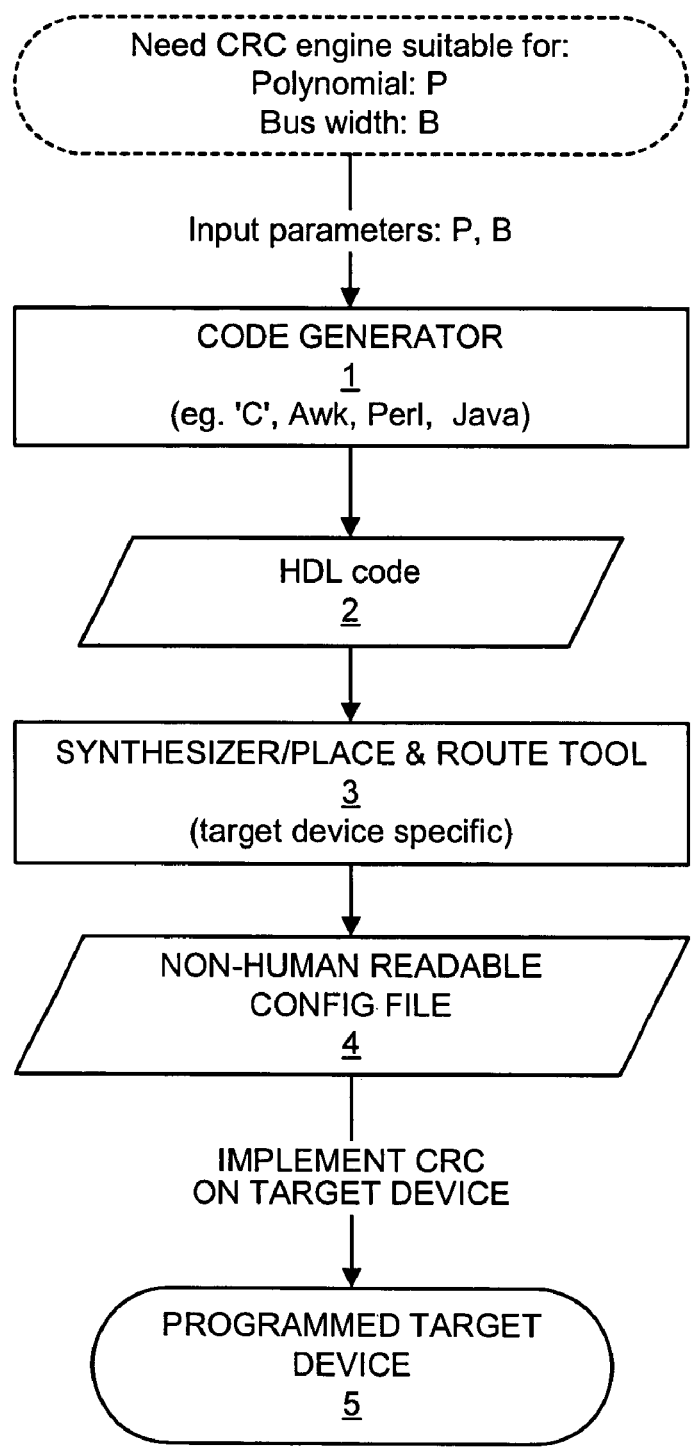
FIG. 1 is a block diagram showing a prior art process of creating a logical device for calculating a CRC.

FIG. 1 illustrates steps involved in creating a CRC calculating device using the prior art methodology. Firstly, a designer is provided with specifications for a desired CRC calculating device, namely the polynomial P and bus width B. Given these constraints, the designer uses a code generator to generate hardware description language (HDL) code which describes the functionality of the CRC calculating device for that specific polynomial and data-bus width combination P and B. Code generators use a range of standard programming languages such as 'C', Awk, Perl and Java.

The HDL code generated by the code generator is then used by a tool such as a "synthesizer" and "place and route tool" to create a configuration file for use by a machine which implements the logic procedure on the programmable target device. Accordingly, the configuration file is usually not readable by humans.

Using the prior art method, designing a CRC calculating device was at least a two step process. First, designers used the code generator, say in 'C', to generate HDL code for particular polynomial and data-bus width combination. Second, they would use the HDL code as input to a synthesis tool to create a configuration file for synthesizing the programmable logic to be implemented on the target device. This slowed the development cycle whenever a new polynomial/bus width combination was required. Designers would usually retain a copy of each version of the code generator program and the resulting HDL code to track the development cycle which also consumed resources.

Figure 2:
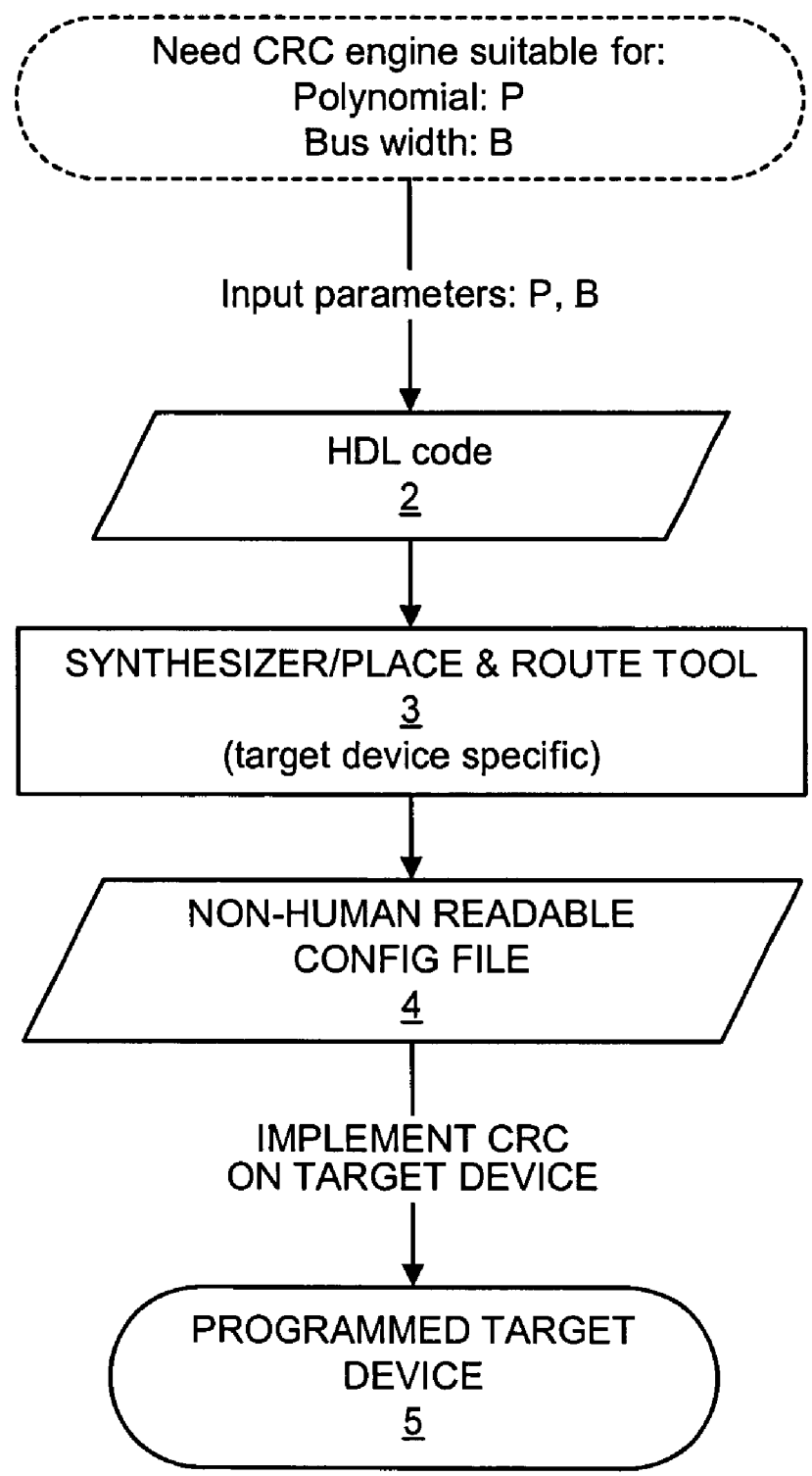
FIG. 2 is a block diagram showing steps used in creating a device for calculating a CRC according to an embodiment of the present invention.
Figure 4:
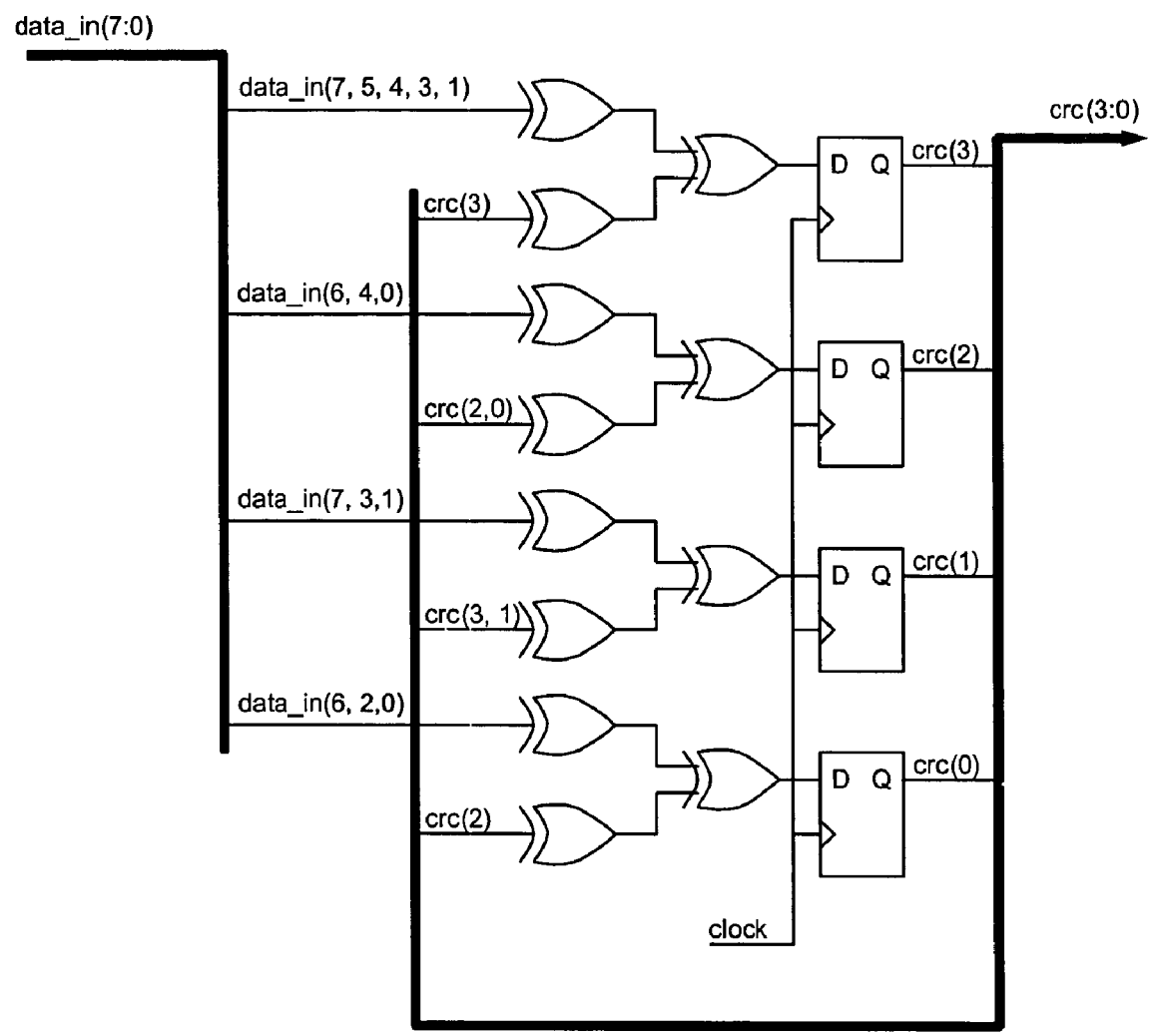
FIG. 4 illustrates an equivalent logic circuit which results after synthesis of the calc_crc( ) function for an embodiment of the invention using a polynomial P=10101, for a 4 bit CRC and a databus 8 bits wide.

Referring now to FIG. 2, according to an embodiment of the invention, a method of creating a logical device performing polynomial division includes using a hardware description language to build code 2 directly describing synthesizable logic as exemplified in FIG. 4 for performing the polynomial division. The method includes implementing the logic on target device 5 using synthesizer/place and route tool 3 which creates non-human readable configuration file 4. Using the method, code 2 receives as inputs parameter P identifying a polynomial and parameter B identifying a number of data bits for which the polynomial division is performed.

The hardware description language may be any suitable language. The hardware description language used in the description of this invention is VHDL although other hardware description languages such as Verilog® may be used as an alternative. The HDL is used to describe synthesizable logic for implementation in programmable logic devices such as Field Programmable Gate Arrays (FPGAs), Application Specific Integrated Circuits (ASICs) and other suitable target devices. The programmed or manufactured target device can then be used to perform polynomial division.

The invention will now be described with reference to the creation of logical devices for calculating CRCs. However, it is to be understood that the invention is also applicable to the creation of logical devices suitable for other applications including but not limited to scramblers and error correction devices and schemes.

Using the method of the present invention, a CRC calculating device can be designed for calculating CRCs for any given generator polynomial and data-bus width combination. The term "data-bus" may be used interchangeably with "data-word". Therefore, the method of the present invention can also be used to design a CRC calculator for calculating CRCs for any generator polynomial and data-word width combination. The data-word/data-bus may have a width being any number of bits but most commonly, the number of bits that make up the data bus is an integer power of 2 ($2^i$, where 'i' is an integer) such as 8, 64, 128, 256 etc.

FIG. 2 shows the steps involved in creating a CRC calculating device according to an embodiment of the invention. Again, the designer is provided with the polynomial P and data-bus width B for which the CRC calculating device is to be created. However, the designer does not use a code generator to generate HDL code built around P and B. Rather, P and B are used directly as inputs to generic HDL code which has been created to describe the behavior or structure of the CRC calculating device, regardless of the polynomial and data bus-width combination.

In one embodiment of the invention, a code fragment identified as calc_crc( ) in Appendix 1 describes a logic procedure for calculating an 'n' bit CRC for a 'B' bit data bus using the polynomial 'P' when given "data_in", being the next word on the data bus and "crc_in", being the crc that resulted from processing the previous data_in word.

For example, the calc_crc function can be used to generate the required logic to calculate a 4 bit CRC for an 8 bit data bus, using generator polynomial $x^4+x^2+x^0$ (which can be represented as vector 10101). Using these input parameters as an example, the HDL code in calc_crc( ) describes the logic procedure for calculating each of the n CRC bits as follows.

```
crc_out(3) =    data_in(7) xor data_in(5) xor data_in(4) xor data_in(3)
                xor data_in(1)
                xor crc_in(3)
crc_out(2) =    data_in(6) xor data_in(4) xor data_in(0)
                xor crc_in(2) xor crc_in(0)
crc_out(1) =    data_in(7) xor data_in(3) xor data_in(1)
                xor crc_in(1) xor crc_in(3)
crc_out(0) =    data_in(6) xor data_in(2) xor data_in(0)
                xor crc_in(2)
```

Figure 3:
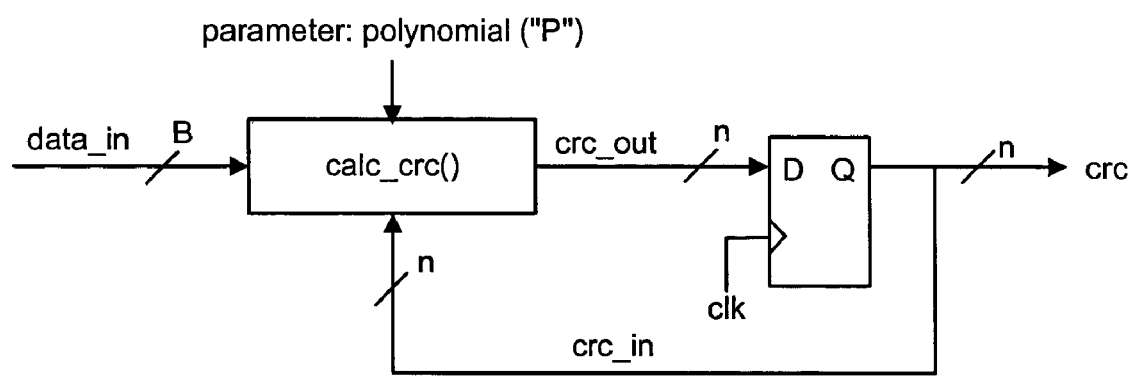
FIG. 3 shows an equivalent logic circuit which results after synthesis of the calc_crc( ) function according to an embodiment of the invention.

In an embodiment of the invention, the calc_crc( ) function is incorporated into the invention's HDL code in such a way that output of the calc_crc( ) function is latched after processing each word. FIG. 3 shows the equivalent logic circuit which results after synthesis. FIG. 4 illustrates the equivalent logic circuit which results after synthesis for the parameters exemplified where polynomial P=10101, n=4 and B=8.

It can be seen that using the method of the present invention, there is no need to separately use a code generator to generate HDL code specific to the polynomial and data-word width combination for which the CRC calculator is being designed. Rather, the values for P and B are input to the code as parameters. Preferably, B is set automatically depending on the number of bits in data_in.

The HDL code is then processed by the synthesis/place and route tool 3 to create a configuration file 4 specific to the polynomial P and data word-width B combination. The required logic is then implemented on the target device resulting in programmed target device 5.

It is to be noted that as wider data-bus widths and larger polynomials are used, the complexity of the XOR logic created for each CRC bit increases. As a consequence in the target device, a signal takes longer to propagate through the many interconnected gates on the silicon wafer from which device 5 is constructed and the maximum achievable clock speed of the design decreases. In an alternative embodiment, designers can improve the operation of a polynomial division logical device (such as a CRC calculating circuit) created according to embodiments of the invention by breaking up the XOR logic function and pipelining sections of it.

Preferably, in addition to generating configuration file 4, synthesizer/place and route tool 3 also generates a report file 6 providing performance characteristics exhibited by programmed target device 5. Such characteristics include the maximum frequency of operation. This can be used to determine the number of pipelined stages which should be included in the logic to improve the performance of the logic device.

Figure 5:
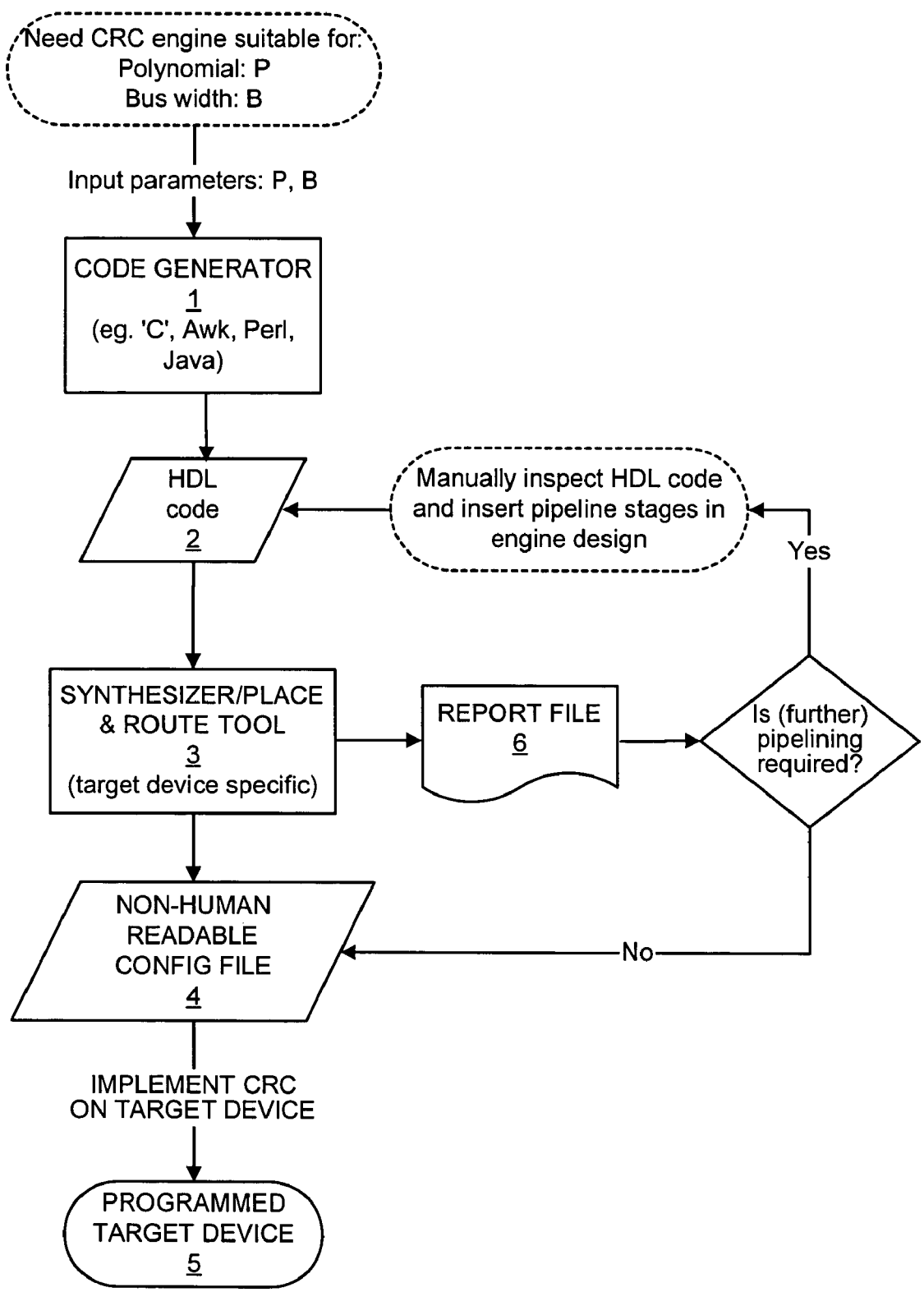
FIG. 5 is a block diagram showing a prior art process of manually incorporating pipelined stages into the HDL code.

In prior art systems pipelined stages were added into the HDL code manually. This process is outlined by the steps shown in FIG. 5. The designer inspected report file 6 to determine if the operational speed of programmed target device 5 would be sufficient for use in a particular system. If the clock speed was insufficient, the designer manually inspected the HDL code and inserted 1 or more pipelined stages into the logic design by inserting additional code fragments in the HDL. This divided the logic into segments, each of which were designed to be performed in a single clock cycle. Although the inclusion of one or more pipelined stages increased the device's operational frequency, the process by which the pipelined stages were incorporated into the design was laborious and time consuming using prior solutions.

In one embodiment of the invention, the number of pipeline stages can be modified simply by changing the value of an input parameter and re-synthesizing the digital logic.

According to a second embodiment of the invention, a method creates a logical device performing polynomial division for a given n-degree polynomial and includes calculating a next n-term remainder for a data unit having d terms. Code is created using a high level description language directly describing synthesizable logic for performing the polynomial division. The n term remainder is calculated by automatically extracting a subset of data terms (using code fragment as identify_data_terms( ) in Appendix 2) for calculating each of the next remainder terms. The next remainder term is then calculated by performing a logical XOR operation on the subset of data terms with a subset of relevant remainder terms which has been calculated for a preceding data unit. The directly synthesizable logic is then implemented on a target device 5.

Preferably, the subset of remainder terms is automatically extracted by, for each of the remainder terms, identifying remainder terms calculated for a preceding data unit which are required to calculate the next remainder, and performing a logical AND on the identified remainder terms with the remainder terms calculated for the preceding data unit. However, any other suitable method for extracting the subset of relevant remainder terms may be used.

As demonstrated in the example provided above, the logic equation required to generate each crc bit is the logical XOR of a subset of the data_in bits with a subset of the current crc bits, crc_in. Therefore, when pipelining stages of the logic device, instead of using the function calc_crc( ) to generate the logic equation for calculating each crc bit, a new function can be used. The new function identifies the bits of data_in that are logically XOR'd together when calculating each crc_out bit.

A code fragment identified as identify_data_terms( ) in Appendix 2 describes a suitable logic procedure to achieve this. The output of this procedure is a set of 'n' vectors of 'B' bits each, where n is the number of bits in the desired CRC. Therefore, there is 1 vector for each crc bit to be calculated. Each bit of a vector represents 1 bit of data_in. If the bit corresponding to a particular data_in bit is '1' then this indicates that the data bit is included in the XOR equation for the related crc_out bit. If the bit corresponding to a particular data_in bit is '0' then this indicates that the data_in bit is not included in the XOR equation for calculating the related crc_out bit.

To demonstrate by way of example, for the crc polynomial and data bus width combination P and B exemplified above, the vectors resulting from the identify_data_terms( ) procedure are as follows.

```
data_xor_ena_vec(3) = 10111010
data_xor_ena_vec(2) = 01010001
data_xor_ena_vec(1) = 10001010
data_xor_ena_vec(0) = 01000101
```

Another function is used to identify the bits of crc_in that are logically XOR'd together when calculating each crc_out bit. A code fragment identified as identify_crc_terms( ) in Appendix 3 describes a suitable logic procedure to achieve this. The output of this procedure is a set of 'n' vectors having 'n' bits, n being the number of bits in each crc term.

Therefore, there is 1 vector for each crc bit to be calculated. Each bit of a vector represents 1 bit of crc_in. If the bit corresponding to a particular crc_in bit is '1' then this indicates that the crc_in bit is included in the XOR equation for the related crc_out bit. If the bit corresponding to a particular crc_in bit is '0' then this indicates that the crc bit is not included in the XOR equation for calculating the related crc_out bit.

Accordingly, using the same polynomial and data-bus width combination P and B already exemplified the vectors resulting from the identify_crc_terms( ) procedure are as follows.

```
crc_xor_ena_vec(3) = 1000
crc_xor_ena_vec(2) = 0101
crc_xor_ena_vec(1) = 1010
crc_xor_ena_vec(0) = 0100
```

The functions identify_data_terms( ) and identify_crc_terms( ) can be incorporated into the HDL code, enabling the data bits and crc bits required to calculate each of the new crc bits to be selected automatically. To calculate the new crc bits, the terms identified by the functions identify_data_terms( ) and identify_crc_terms( ) are logically XOR'd together. The value of the new crc bits is then latched after each word is processed. A logic circuit illustrating this process for one of the 'n' crc bits is provided in FIG. 6.

Figure 6:
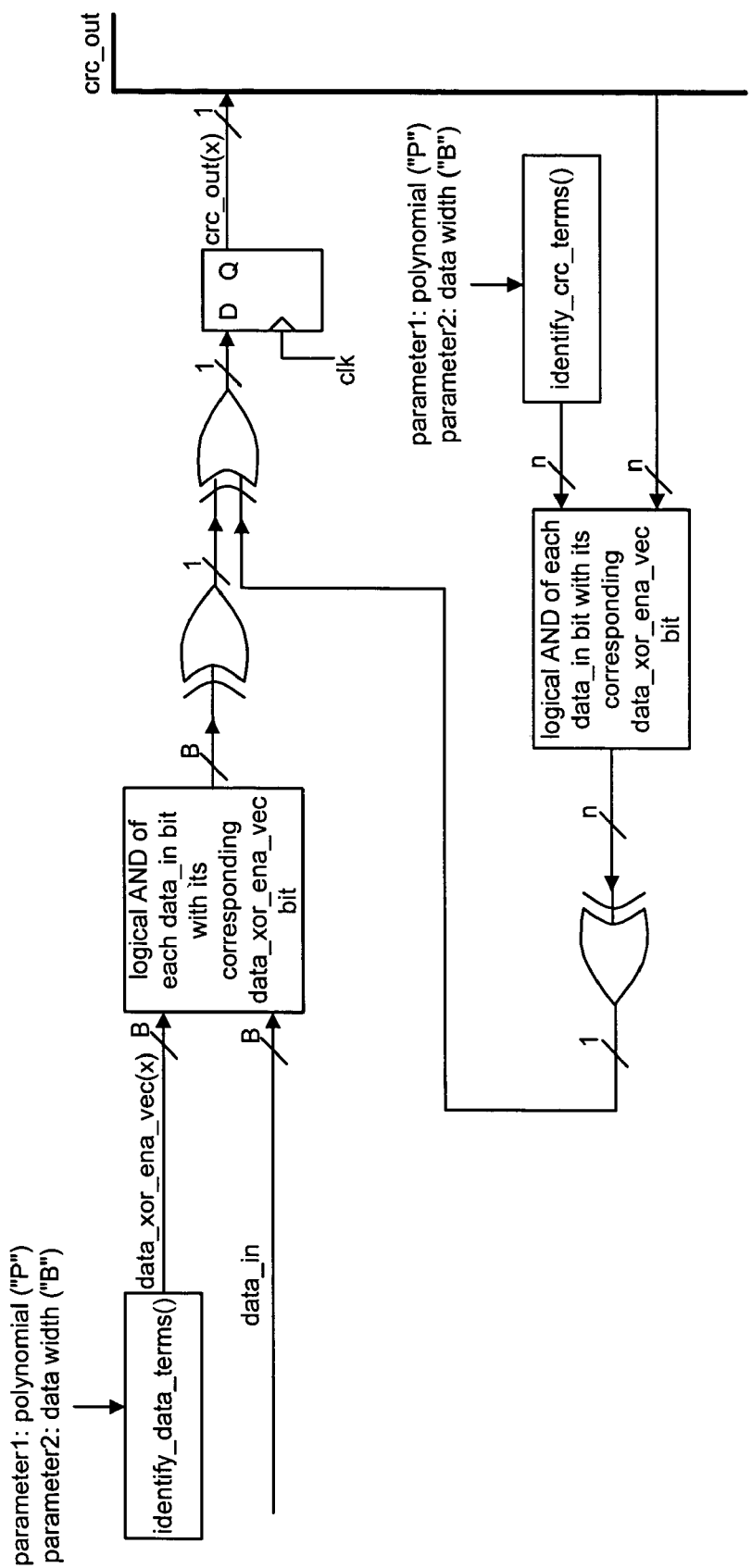
FIG. 6 illustrates an equivalent logic circuit for an embodiment of the invention incorporating the functions identify_data_terms( ) and identify_crc_terms( ) which select the data bits and crc bits required to calculate each of the new crc bits automatically.

By performing the process of logically AND-ing each data_in bit with it's corresponding data_xor_ena_vec bit, it can be seen that irrelevant data_in bits are disregarded or effectively masked out from the logical XOR function calculating the nth crc bit (since Y XOR '0'=Y). Other suitable methods for eliminating irrelevant data_in bits from the input to XOR gate may be used as an alternative. After synthesis, the circuit of FIG. 6 is reduced to a logic circuit which is identical to that which is generated using the calc_crc( ) function of Appendix 1.

Figure 7:
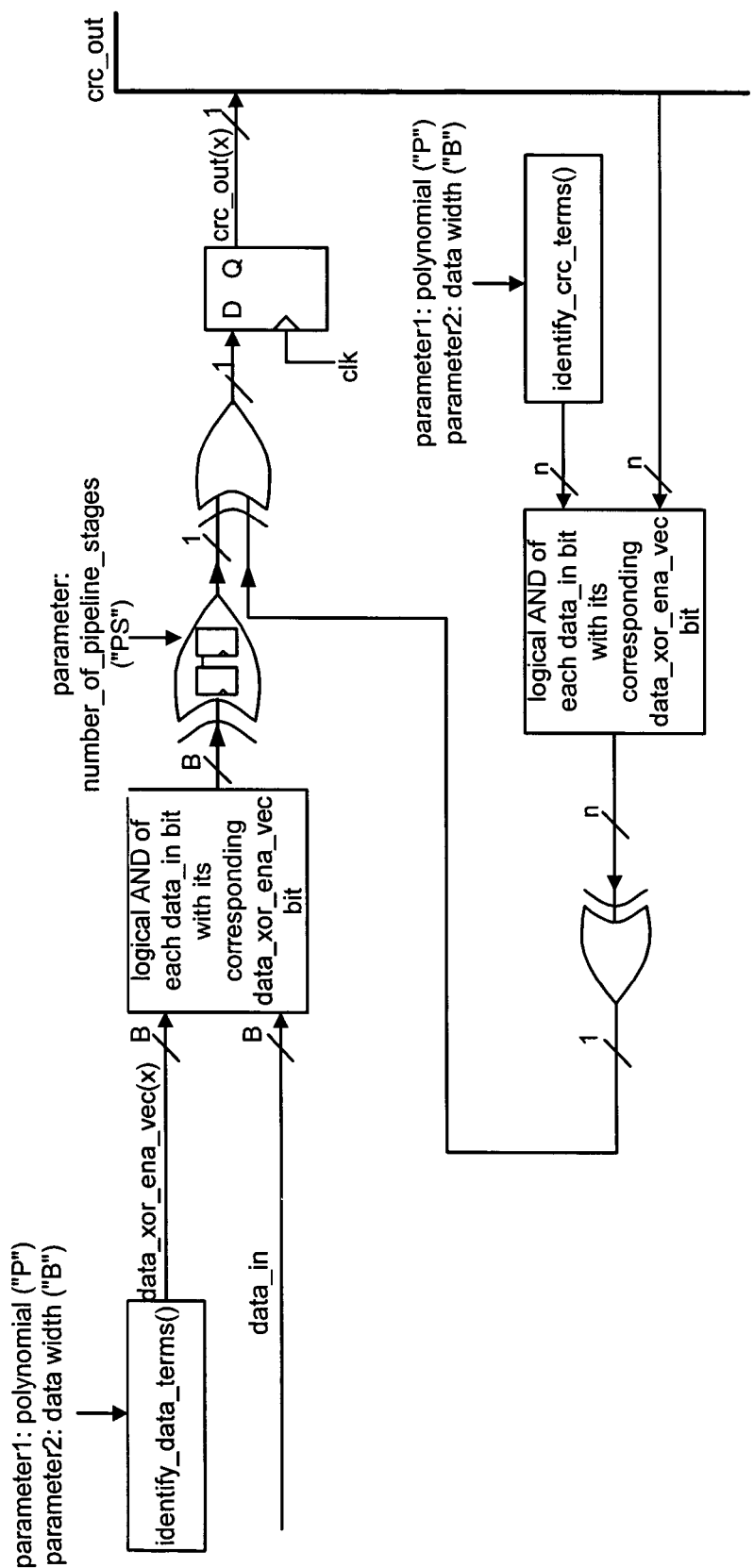
FIG. 7 illustrates the equivalent logic circuit of FIG. 6, further including a pipelined XOR gate having a number of pipeline stages determined by the parameter "number_of-_pipeline_stages".

Advantageously, in one embodiment of the invention illustrated in FIG. 7, the maximum operating frequency of the XOR logic procedure can be improved by employing a pipelined XOR element 8 (which is known in the art) instead of a simple XOR element 7 (as in FIG. 6), to combine the masked data_in bits with the masked crc_out bits. This allows the number of pipeline stages used in the calculation of the crc to be varied simply by changing a parameter. This parameter can be provided directly to the HDL code and is identified in FIG. 7 as "number_of_pipeline_stages". A final circuit described by such HDL code before synthesis is illustrated in FIG. 7. If the number of pipeline stages is zero, the circuit will operate as the non-pipelined circuit of FIG. 6.

While the embodiments of the present invention have been illustrated in detail, it should be apparent that modifications and adaptations to these embodiments may occur to one skilled in the art without departing from the scope of the present invention as set forth in the following claims.

APPENDIX I

```
pure function calc_crc(
    constant polynomial : std_logic_vector;
        --the polynomial represented as a vector
        --Eg. x^4 + x^2 + 1x^0 => polynomial := " 10101"
        --Eg HDLC-16 CRC Poly is x^16 + x^12 +x^5 + 1 => "10001000000100001";
        --Eg HDLC-32 CRC Poly is
        -- x^32+x^26+x^23+x^22+x^16+x^12+x^11+x^10+x^8+x^7+x^5+x^4+x^2+x^1+x^0
        -- => "10000010011000001000111011011011011";
    constant augmented_message : boolean;
        --when true, the message must be augmented
        -- (followed by 'n' bits where 'n' = bits in crc)
        --when false, the message does not have to be augmented.
    crc_in : std_logic_vector;
        --current value of the crc MUST have MSB in the LEFTMOST bit.
    data_in : std_logic_vector
        --The new data word. This is always processed LEFT to RIGHT
) return std_logic_vector is
    -- returned CRC value will always have MSB in the LEFTMOST bit.
    constant data_bits : integer : = data_in'length;
    constant crc_bits_integer := crc_in'length;
    variable data : std_logic_vector(data_bits-1 downto 0);
    variable crc_new : std_logic_vector(crc_bits-1 downto 0);
    variable crc : std_logic_vector(crc_bits-1 downto 0);
    variable crc_out : std_logic_vector(crc_in'range);
    variable c_polynomial : std_logic_vector(crc_bits downto 0) : = polynomial;
        --avoids problems with range direction
begin
    data := data_in; --avoids problems with range direction
    crc := crc_in;
    for word_bit_num in data_bits-1 downto 0 loop
        if augmented_message then
            --this algorithm requires augmented message
            --(ie message appended with 'n' zero's where 'n' is num of bits in CRC)
            for crc_bit_num in crc_bits-1 downto 1 loop
                if c_polynomial(crc_bit_num) = '1' then
                    crc_new(crc_bit_num) := crc(crc_bit_num-1) xor crc(crc_bits-1);
                else
                    crc_new(crc_bit_num) := crc(crc_bit_num-1);
                end if;
```

APPENDIX I-continued

```
            end loop;
            crc_new(0) :=data(word_bit_num) xor crc(crc_bits-1);
            crc := crc_new;
        else
            --this algorithm does not require an augmented message
            for crc_bit_num in crc_bits-1 downto 1 loop
                if c_polynomial(crc_bit_num) = '1' then
                    crc_new(crc_bit_num) := crc(crc_bit_num-1) xor (crc(crc_bits-1) xor data(word_bit_num));
                else
                    crc_new(crc_bit_num) crc(crc_bit_num-1);
                end if;
            end loop;
            crc_new(0) := data(word_bit_num) xor crc(crc_bits-1);
            crc := crc_new;
        end if; --augmented message
    end loop;
    crc_out := crc_new; --match output to port range
    return crc_out;
end function calc_crc;
```

APPENDIX 2

```
pure function identify_data_terms (
        augmented_message : boolean;
        crc_bits : integer;
        polynomial : std_logic_vector;
        data_bits : integer
    ) return data_xor_ena_vec_array_type is
    variable data_xor_ena_vec : data_xor_ena_vec_array_type;
    variable data_bit_enable : std_logic_vector(data_bits-1 downto 0);
    variable data_bit_xor_ena : std_logic_vector(crc_bits-1 downto 0);
    constant zero_crc : std_logic_vector(crc_bits-1 downto 0) := (others => '0');
begin
    data_xor_ena_vec := (others => (others => '0'));
    for word_bit_num in data_bits-1 downto 0 loop
        --create a mask to represent the current word_bit_num
        --eg 100000000 or 01000000 etc
        data_bit_enable := (others => '0');
        data_bit_enable(word_bit_num) := '1';
        --find out if this data bit is a term
        --in each crc_bit's xor function
        data_bit_xor_ena := calc_crc(
                    polynomial => polynomial,
                    augmented_message => augmented_message,
                    crc_in => zero_crc,
                    data_in => data_bit_enable
                );
        --assign the result to the appropriate entry in the data_xor_ena_vec
        for crc_bit in crc_bits-1 downto 0 loop
            data_xor_ena_vec(crc_bit) (word_bit_num) := data_bit_xor_ena(crc_bit);
        end loop;
    end loop;
    return data_xor_ena_vec;
end function identify_data_terms;
```

APPENDIX 3

```
pure function identify_crc_terms(
        augmented_message : boolean;
        crc_bits : integer;
        polynomial : std_logic_vector;
        data_bits : integer
    ) return crc_xor_ena_vec_array_type is
    variable crc_xor_ena_vec : crc_xor_ena_vec_array_type;
    variable crc_bit_enable : std_logic_vector(crc_bits-1 downto 0);
```

APPENDIX 3-continued

```
        variable crc_bit_xor_ena : std_logic_vector(crc_bits-1 downto 0);
        constant zero_data : std_logic_vector(data_bits-1 downto 0) := (others => '0');
        variable c_polynomial : std_logic_vector(crc_bits downto 0) := polynomial;
        --avoids direction ambiguity
    begin
        crc_xor_ena_vec := (others => (others => '0'));
        for word_bit_num in crc_bits-1 downto 0 loop
            --create a mask to represent the current word_bit_num
            --eg 100000000 or 01000000 etc
            crc_bit_enable := (others => '0');
            crc_bit_enable(word_bit_num) := '1';
            --find out if this crc bit is a term
            --in each crc bit's xor function
            crc_bit_xor_ena := calc_crc(
                            polynomial => c_polynomial,
                            augmented_message => augmented_message,
                            crc_in => crc_bit_enable,
                            data_in => zero_data
                        );
            --assign the result to the appropriate entry in the
crc_xor_ena_vec
            for crc_bit in crc_bits-1 downto 0 loop
                crc_xor_ena_vec(crc_bit) (word_bit_num) := crc_bit_xor_ena(crc_bit);
            end loop;
        end loop;
        return crc_xor_ena_vec;
    end function identify_crc_terms;
```

The invention claimed is:

1. A method of creating a logical device performing polynomial division for a given n-degree polynomial including calculating a next n-term remainder for a data unit having d terms, the method including:
  (a) creating code using a high level description language directly describing synthesizable logic for performing the polynomial division including:
    (i) automatically extracting a subset of data terms for calculating each of the next remainder terms by identifying data terms in an incoming data unit which are required for calculating a respective next remainder term and performing a first logical AND operation on the identified data terms with the incoming data unit; and
    (ii) calculating the next remainder by performing a logical XOR operation on the subset of data terms with a subset of relevant remainder terms calculated for a preceding data unit; and
  (b) implementing the logic on a target device;
  wherein performing the first logical AND operation eliminates data terms not required for calculating the next remainder.

2. The method according to claim 1 wherein identifying the incoming data terms required for calculating a respective next remainder term includes creating a data-enable vector with d terms by, for each of the data terms:
  (a) resetting all terms in the data unit;
  (b) asserting a current data term;
  (c) determining a logic equation for calculating the next remainder; and
  (d) if the asserted data term is present in the logic equation, asserting a corresponding term of the data-enable vector;
    wherein the identified data terms used in the first logical AND operation are corresponding terms of the data-enable vector.

3. The method according to claim 1 wherein the subset of remainder terms is automatically extracted by, for each of the remainder terms:
  (i) identifying remainder terms calculated for a preceding data unit which are required to calculate the next remainder, and
  (ii) performing a second logical AND on the identified remainder terms with the remainder terms calculated for the preceding data unit.

4. The method according to claim 3 wherein identifying remainder terms calculated for a preceding data unit which are required to calculate the next remainder includes creating a remainder term-enable vector with n terms by, for each of the remainder terms:
  (a) resetting all remainder terms;
  (b) asserting a current remainder term;
  (c) determining a logic equation for calculating the next remainder; and
  (d) if the asserted remainder term is present in the logic equation, asserting a corresponding term of the remainder term-enable vector;
    wherein the identified remainder terms used in the second logical AND operation are corresponding terms of the remainder term-enable vector.

5. The method according to claim 1 wherein the logical device is used in one or more of the following:
  (a) a cyclic redundancy checker;
  (b) a cyclic redundancy calculator;
  (c) a scrambler;
  (d) an error correction device; and
  (e) a component of an error correction scheme.

6. The method according to claim 1 wherein the target device includes at least one of:
  (a) a field programmable gate array;
  (b) an application specific integrated circuit; and
  (c) any other suitable logic device on which the logic may be implemented.

7. The method according to claim 1 wherein the logical XOR operation includes a pipelined XOR operation with a pre-definable number of pipeline stages, the pipelined XOR operation operating on the subset of data terms.

8. A computer program product residing on a programmable medium containing hardware description language code directly describing synthesizable logic suitable for implementation on a target device conveying a programmed method of performing polynomial division on units of data each having d terms and using a polynomial of degree n to calculate a next remainder having n terms, the programmed method comprising:
  (i) automatically extracting a subset of data terms for calculating each of the next remainder terms by identifying data terms in an incoming data unit which are required for calculating a respective next remainder term and performing a first logical AND operation on the identified data terms with the incoming data unit; and
  (ii) calculating the next remainder by performing a logical XOR operation on the subset of data terms with a subset of relevant remainder terms calculated for a preceding data unit.

9. The computer program product according to claim 8 wherein the programmed method further comprises creating a data-enable vector with d terms to identify the incoming data terms required for calculating a respective next remainder term, the data-enable vector being created by, for each of the data terms:
  (a) resetting all terms in the data unit;
  (b) asserting a current data term;
  (c) determining a logic equation for calculating the next remainder; and
  (d) if the asserted data term is present in the logic equation, asserting a corresponding term of the data-enable vector;
    wherein the identified data terms used in the first logical AND operation are corresponding terms of the data-enable vector.

10. The computer program product according to claim 8 wherein the programmed method further comprises identifying the subset of relevant remainder terms calculated for the previous data unit automatically by, for each of the remainder terms:
  (i) identifying remainder terms calculated for the preceding data unit which are required to calculate the next remainder, and
  (ii) performing a second logical AND on the identified remainder terms with the remainder terms calculated for the preceding data unit.

11. The computer program product according to claim 10 wherein the programmed method further comprises identifying the remainder terms calculated for the preceding data unit which are required to calculate the next remainder by creating a remainder term-enable vector having n terms, the remainder term-enable vector being created by, for each of the remainder terms:
  (a) resetting all remainder terms;
  (b) asserting a current remainder term;
  (c) determining a logic equation for calculating the next remainder; and
  (d) if the asserted remainder term is present in the logic equation, asserting a corresponding term of the remainder term-enable vector;
    wherein the identified remainder terms used in the second logical AND operation are corresponding terms of the remainder term-enable vector.

12. A method according to claim 8 wherein the logical XOR operation includes a pipelined XOR operation with a pre-definable number of pipeline stages, the pipelined XOR operation operating on the subset of data terms.

13. A computer program product residing on a programmable medium containing hardware description language code directly describing synthesizable logic suitable for implementation on a target device conveying a programmed method of performing polynomial division on units of data each having d terms and using a polynomial of degree n to calculate a next remainder having n terms, the programmed method comprising:
  (i) automatically extracting a subset of data terms for calculating each of the next remainder terms; and
  (ii) calculating the next remainder by performing a logical XOR operation on the subset of data terms with a subset of relevant remainder terms calculated for a preceding data unit;
  wherein the subset of remainder terms is identified automatically by, for each of the remainder terms, identifying remainder terms calculated for the preceding data unit which are required to calculate the next remainder, and performing a first logical AND on the identified remainder terms with the remainder terms calculated for the preceding data unit.

14. The computer program product according to claim 13 wherein the programmed method further comprises identifying the remainder terms calculated for the preceding data unit which are required to calculate the next remainder by creating a remainder term-enable vector having n terms, the remainder term-enable vector being created by, for each of the remainder terms:
  (a) resetting all remainder terms;
  (b) asserting a current remainder term;
  (c) determining a logic equation for calculating the next remainder; and
  (d) if the asserted remainder term is present in the logic equation, asserting a corresponding term of the remainder term-enable vector;
    wherein the identified remainder terms used in the first logical AND operation are corresponding terms of the remainder term-enable vector.

15. The computer program product according to claim 13 wherein the programmed method further comprises extracting the subset of data terms by:
  (a) identifying data terms in an incoming data unit which are required for calculating a respective next remainder term; and
  (b) performing a second logical AND operation on the identified data terms with the incoming data unit.

16. The computer program product according to claim 15 wherein the programmed method further comprises creating a data-enable vector with d terms to identify the incoming data terms required for calculating a respective next remainder term, the data-enable vector being created by, for each of the data terms:
  (a) resetting all terms in the data unit;
  (b) asserting a current data term;
  (c) determining a logic equation for calculating the next remainder; and
  (d) if the asserted data term is present in the logic equation, asserting a corresponding term of the data-enable vector;
    wherein the identified data terms used in the second logical AND operation are corresponding terms of the data-enable vector.

17. A computer program product according to claim 13 wherein the logical XOR operation includes a pipelined logical XOR operation with a pre-definable number of pipeline stages, the pipelined logical XOR operation operating on the subset of data terms.

18. A method of creating a logical device performing polynomial division for a given n-degree polynomial including calculating a next n-term remainder for a data unit having d terms, the method including:
(a) creating code using a high level description language directly describing synthesizable logic for performing the polynomial division including:
    (i) automatically extracting a subset of data terms for calculating each of the next remainder terms; and
    (ii) calculating the next remainder by performing a logical XOR operation on the subset of data terms with a subset of relevant remainder terms calculated for a preceding data unit; and
(b) implementing the logic on a target device;
    wherein the subset of remainder terms is automatically extracted by, for each of the remainder terms, identifying remainder terms calculated for a preceding data unit which are required to calculate the next remainder and performing a first logical AND on the identified remainder terms with the remainder terms calculated for the preceding data unit.

19. The method according to claim 18 wherein identifying remainder terms calculated for a preceding data unit which are required to calculate the next remainder includes creating a remainder term-enable vector with n terms by, for each of the remainder terms:
(a) resetting all remainder terms;
(b) asserting a current remainder term;
(c) determining a logic equation for calculating the next remainder; and
(d) if the asserted remainder term is present in the logic equation, asserting a corresponding term of the remainder term-enable vector;
    wherein the identified remainder terms used in the first logical AND operation are corresponding terms of the remainder term-enable vector.

20. The method according to claim 18 wherein the subset of data terms is extracted by:
(a) identifying data terms in an incoming data unit which are required for calculating a respective next remainder term; and
(b) performing a second logical AND operation on the identified data terms with the incoming data unit;
    wherein performing the second logical AND operation eliminates data terms not required for calculating the next remainder.

21. The method according to claim 20 wherein identifying the incoming data terms required for calculating a respective next remainder term includes creating a data-enable vector with d terms by, for each of the data terms:
(a) resetting all terms in the data unit;
(b) asserting a current data term;
(c) determining a logic equation for calculating the next remainder; and
(d) if the asserted data term is present in the logic equation, asserting a corresponding term of the data-enable vector;
    wherein the identified data terms used in the second logical AND operation are corresponding terms of the data-enable vector.

22. The method according to claim 18 wherein the logical XOR operation includes a pipelined XOR operation with a pre-definable number of pipeline stages, the pipelined XOR operation operating on the subset of data terms.

* * * * *